United States Patent [19]
Sato et al.

[11] Patent Number: 5,890,186
[45] Date of Patent: Mar. 30, 1999

[54] MEMORY CIRCUIT WITH BUILT-IN CACHE MEMORY

[75] Inventors: Katsuhiko Sato; Shinji Miyano, both of Yokohama; Tomoaki Yabe, Kawasaki, all of Japan; Tohru Furuyama, South Burlington, Vt.

[73] Assignee: Kabushiki Kaisha Toshiba, Kawasaki, Japan

[21] Appl. No.: 895,863

[22] Filed: Jul. 17, 1997

Related U.S. Application Data

[63] Continuation of Ser. No. 443,368, May 17, 1995, abandoned.

[30] Foreign Application Priority Data

May 18, 1994 [JP] Japan .................................. 6-103882

[51] Int. Cl.$^6$ .................................................. G11C 11/34
[52] U.S. Cl. .............................. 711/3; 711/113; 711/118; 711/119; 711/120; 711/202; 365/230.03; 365/203; 365/233
[58] Field of Search .............................. 365/230.03, 203, 365/233; 711/113, 118, 119, 120, 202, 3

[56] References Cited

U.S. PATENT DOCUMENTS

| | | | |
|---|---|---|---|
| 5,091,889 | 2/1992 | Hamano et al. | 365/203 |
| 5,111,386 | 5/1992 | Fujishima et al. | 395/445 |
| 5,317,540 | 5/1994 | Furuyama | 365/230.01 |
| 5,361,227 | 11/1994 | Takana et al. | 365/189.01 |
| 5,504,709 | 4/1996 | Yabe et al. | 365/190 |
| 5,517,454 | 5/1996 | Sato et al. | 365/222 |

*Primary Examiner*—Eddie P. Chan
*Assistant Examiner*—T. V. Nguyen
*Attorney, Agent, or Firm*—Banner & Witcoff, Ltd.

[57] ABSTRACT

When data stored in a memory cell of a memory cell array is written into cache memory, a write signal LW is set at an "H" level. The write signal LW is input into a data-line pair initialization select circuit via an initialization control circuit, and a signal EQE is set at an "H" level in all columns. A data-line pair initialization circuit then sets the potential of the data-line pairs in all columns at the same level. When the write signal LW is input to a transfer gate via a transfer gate control circuit, the transfer gates in all columns are turned ON. The delay time of the transfer gate control circuit is the same as or greater than the delay time of the initialization control.

13 Claims, 7 Drawing Sheets

FIG. 8(a)   WL 
FIG. 8(b)   BL/$\overline{BL}$ 
FIG. 8(c)   LW 
FIG. 8(d)   LWD 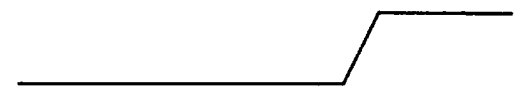
FIG. 8(e)   EQ 
FIG. 8(f)   DL/$\overline{DL}$ 
FIG. 9(a)   CSL 
FIG. 9(b)   WB 
FIG. 9(c)   EQ 
FIG. 9(d)   DL/$\overline{DL}$ 

FIG. 12(a) WL 
FIG. 12(b) BL/$\overline{BL}$ 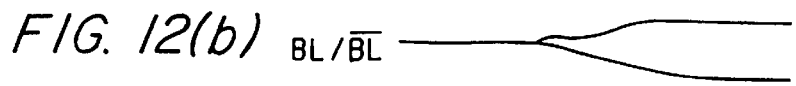
FIG. 12(c) LW 
FIG. 12(d) LWD 
FIG. 12(e) EQ 
FIG. 12(f) EQE 
FIG. 12(g) DL/$\overline{DL}$ 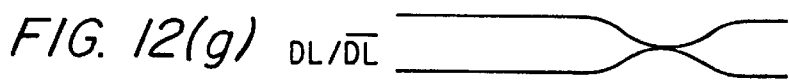
FIG. 12(h) CSL  "0"
FIG. 13(a) CSL 
FIG. 13(b) WB 
FIG. 13(c) EQ 
FIG. 13(d) EQE 
FIG. 13(e) DL/$\overline{DL}$ 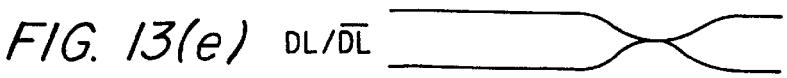
FIG. 13(f) LW  "0"

MEMORY CIRCUIT WITH BUILT-IN CACHE MEMORY

This application is a continuation of application Ser. No. 08/443,368, filed May 17, 1995, now abandoned.

BACKGROUND OF THE INVENTION

1. Field of the Invention

The present invention relates to a memory circuit, and more particularly to improvements in a dynamic memory circuit containing a cache memory.

2. Description of the Related Art

FIG. 1 shows the main portion of a conventional dynamic memory circuit with a built-in cache memory.

Each memory cell MC in a memory cell array is connected to a word line WL and a pair of bit lines BL and /BL. Each bit line pair BL, /BL is connected to a sense amplifier SA.

A cache memory 11 is composed of two inverter circuits I, I'. Here, the cache memory 11 holds data statically. The cache memory may be composed of two MOS transistors cross-coupled, in which case, the cache memory retains data dynamically.

Each first transfer gate 12 is composed of two n-channel MOS transistors N1, N1'. Each second transfer gate 13 is made up of two n-channel MOS transistors N2, N2'.

One end of each cache memory 11 is connected to the corresponding sense amplifier SA (bit line BL) via the corresponding first transfer gate 12, and also to one of the corresponding DQ-line pair (data-line pair) via the corresponding second transfer gate 13. The other end of each cache memory 11 is connected to the corresponding sense amplifier SA (bit line /BL) via the corresponding first transfer gate 12 and also to the other of the corresponding DQ-line pair via the corresponding second transfer gate 13.

The first transfer gate 12 is controlled by the output signal LWD of a first transfer gate control circuit 14. The first transfer gate control circuit 14 receives a write signal LW and outputs an output signal LWD.

The second transfer gates 13 are controlled by the output signal CSL of a column decoder 15.

In the dynamic memory device with a built-in cache memory thus constructed, data is written from the memory cell MC into the cache memory 11 by causing the first transfer gate control circuit 14 to enable the first transfer gate 12, thereby allowing the data read from the memory cell MC to be transferred to the cache memory 11 via the sense amplifier SA.

Thereafter, when the column decoder 15 enables the specific second transfer gate 13, the data stored in the cache memory 11 connected to the second transfer gate 13 is transferred to the corresponding DQ-line pair and outputted to the outside world via a buffer circuit 15A.

Data writing from the DQ-line pair into the cache memory 11 is effected by causing the column decoder 15 to enable the specific second transfer gate 13 and transferring the externally inputted data to the cache memory 11 via a buffer circuit 15B and the second transfer gate 13.

Thereafter, when the column decoder 15 enables the specific second transfer gate 13, the data stored in the cache memory 11 is transferred to the corresponding DQ-line pair and outputted to the outside world via the buffer circuit 15A.

With the recent trend toward increasingly faster memory devices, there is accordingly a demand in the field of dynamic memory circuits and those with a built-in cache memory toward higher-speed operation. To achieve higher-speed operation, they are designed to be synchronous memory circuits using external clock signals.

There are two cases where data is written into the cache memory in the dynamic memory circuit containing a cache memory: one case where the data read from the memory cell is written into and the other where the externally inputted data is written into.

In these cases where data is written into the cache memory, when the data to be written into the cache memory is the reverse of the data already written in the cache memory, the data already written in the cache memory must be reversed. The disadvantage of these cases is, therefore, that it takes a longer time to write data into the cache memory.

This disadvantage can be overcome by decreasing the driving power of the cache memory and increasing the driving power of the buffer that drives the sense amplifier and DQ-line pair and further increasing the driving power of the first and second transfer gates.

In this case, however, because the driving power of the sense amplifier becomes large, the operation margin in transferring data from the cache memory to the memory cell decreases and the driving power of the buffer for driving the DQ-line pair increases, resulting in a drop in the operation margin in transferring data from the cache memory to the DQ-line pair.

SUMMARY OF THE INVENTION

It is, accordingly, an object of the present invention to overcome the above disadvantage by providing a memory circuit with a built-in cache memory which can not only write data in the cache memory at high speeds, but also read data from the cache memory at high speeds.

To achieve the foregoing object, [a] a memory circuit with a built-in cache memory of the present invention comprises: a first transfer gate connected between a bit-line pair and a data-line pair; a second transfer gate connected between a DQ-line pair and the data-line pair; a cache memory connected to the data-line pair; and means for placing the potential of the data-line pair at the same potential.

The means contains a data-line pair initializing circuit for short-circuiting the data-line pair and an initialization control circuit for determining a period of time during which the data-line pair is short-circuited.

The memory circuit of the invention further comprises a first transfer gate control circuit for enabling the first transfer gate at the same time or after the short-circuiting of the data-line pair is completed, and then writing the data in a memory cell into the cache memory.

The memory circuit of the invention further comprises a second transfer gate control circuit for enabling the second transfer gate at the same time or after the short-circuiting of the data-line pair is completed and then writing the externally inputted data into the cache memory.

The data-line pair initializing circuit contains a MOS transistor, whose source is connected to one of the data-line pair, whose drain is connected to the other of the data-line pair, and whose gate is connected to the initialization control circuit.

[b] A memory circuit with a built-in cache memory of the invention comprises: a first transfer gate connected between a bit-line pair and a data-line pair; a second transfer gate connected between a DQ-line pair and the data-line pair; a cache memory connected to the data-line pair; and means for placing the potential of the data-line pair at the same potential.

The means contains a data-line pair initializing circuit for precharging the data-line pair to a specific potential and an initialization control circuit for determining a period of time during which the data-line pair is precharged to the specific potential.

A memory circuit of the invention further comprises a first transfer gate control circuit for enabling the first transfer gate at the same time or after the precharging of the data-line pair is completed, and then writing the data in a memory cell into the cache memory.

A memory circuit of the invention further comprises a second transfer gate control circuit for enabling the second transfer gate at the same time or after the precharging of the data-line pair is completed and then writing the externally inputted data into the cache memory.

The data-line pair initializing circuit contains first and second MOS transistors, the source of the first MOS transistor being connected to a power-supply terminal applied with a specific potential, its drain being connected to one of the data-line pair, and its gate being connected to the initialization control circuit, and the source of the second MOS transistor being connected to the power-supply terminal, its drain being connected to the other of the data-line pair, and its gate being connected to the initialization control circuit.

[c] A memory circuit with a built-in cache memory of the invention comprises a plurality of columns. Each column comprises: a first transfer gate connected between a bit-line pair and a data-line pair; a second transfer gate connected between a DQ-line pair and the data-line pair; a cache memory connected to the data-line pair; and means for selectively placing the potential of the data-line pair in each column at the same potential.

The means contains a data-line pair initializing circuit for short-circuiting the data-line pair, a data-line pair initialization select circuit for selecting one or more columns that short-circuit data-line pairs from the plurality of columns, and an initialization control circuit for determining a period of time during which the data-line pair is short-circuited.

A memory circuit of the invention further comprises a first transfer gate control circuit for enabling the first transfer gate at the same time or after the short-circuiting of the data-line pairs in all of the columns is completed, and then writing the data in a memory cell into the cache memories in all of the columns.

A memory circuit of the invention further comprises a second transfer gate control circuit for enabling the second transfer gate in the selected column at the same time or after the short-circuiting of the data-line pair in the column selected from the plurality of columns is completed and then writing the externally inputted data into the cache memory in the selected column.

The data-line pair initializing circuit contains a MOS transistor, whose source is connected to one of the data-line pair, whose drain is connected to the other of the data-line pair, and whose gate is connected to the data-line pair initialization select circuit.

[d] A memory circuit with a built-in cache memory of the invention comprises a plurality of columns. Each column comprises: a first transfer gate connected between a bit-line pair and a data-line pair; a second transfer gate connected between a DQ-line pair and the data-line pair; a cache memory connected to the data-line pair; and means for selectively placing the potential of the data-line pair in each column at the same potential.

The means contains a data-line pair initializing circuit for precharging the data-line pair to a specific potential, a data-line pair initialization select circuit for selecting a column that precharges the data-line pair from the plurality of columns, and an initialization control circuit for determining a period of time during which the data-line pair is precharged to the specific potential.

A memory circuit of the invention further comprises a first transfer gate control circuit for enabling the first transfer gates in all of the columns at the same time or after the precharging of the data-line pairs in all of the columns is completed, and then writing the data in a memory cell into the cache memories in all of the columns.

A memory circuit of the invention further comprises a second transfer gate control circuit for enabling the second transfer gate in the selected column at the same time or after the precharging of the data-line pair in the column selected from the plurality of columns is completed and then writing the externally inputted data into the cache memory in the selected column.

The data-line pair initializing circuit contains a first and second MOS transistors, the source of the first MOS transistor being connected to a power-supply terminal applied with a specific potential, its drain being connected to one of the data-line pair, and its gate being connected to the data-line pair initialization select circuit, and the source of the second MOS transistor being connected to the power-supply terminal, its drain being connected to the other of the data-line pair, and its gate being connected to the data-line pair initialization select circuit.

Because the memory circuits with the configurations of items [a] and [b] contain means for placing the data-line pair at the same potential, the data already stored in the cache memory can be destroyed. Therefore, when new data is written into the cache memory, the writing can be done at high speeds.

Furthermore, to place the data-line pair at the same potential, the data-line pair initializing circuit and initialization control circuit that controls the initializing circuit are provided. With these circuits, the data-line pair can be short-circuited or set at a specific potential, thereby equalizing or precharging the data-line pair. Therefore, high-speed writing can be realized.

Furthermore, because the first or second transfer gate control circuit enables the first or second transfer gate at the same time or after the short-circuiting or precharging of the data-line pair is completed, the time required to write data can be shortened without fail.

Additionally, because the data-line pair initializing circuit can be composed of one or two MOS transistors, this enables a very simple circuit configuration to short-circuit or precharge the data-line pair.

Because the memory circuits with the configurations of items [c] and [d] contain means for selectively placing the data-line pair at the same potential on a column basis, only the cache memory into which new data is to be written can be initialized. Therefore, when new data is written into the cache memory in the selected column, data can be written at high speeds.

Furthermore, to selectively place the data-line pair at the same potential, the data-line pair initializing circuit, data-line pair initialization select circuit, and initialization control circuit that controls these two circuits are provided. With these circuits, the data-line pair can be short-circuited or set at a specific potential, thereby equalizing or precharging the data-line pair. Therefore, high-speed writing can be realized.

Furthermore, when the data in the memory cell is written into the cache memory, the first transfer gate is enabled at the same time or after the short-circuiting or precharging of the data-line pair is completed. On the other hand, when the external data is written into the cache memory, the second transfer gate is enabled at the same time or after the data-line pair is short-circuited or precharged. Therefore, the time required to write data can be shortened without fail.

Additionally, because the data-line pair initializing circuit can be composed of one or two MOS transistors, this enables a very simple circuit configuration to short-circuit or precharge the data-line pair.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 8 is a timing chart for the case where the data in the memory cell is written into the cache memory in the memory circuit of FIG. 2;

FIG. 9 is a timing chart for the case where the external input data is written into the cache memory in the memory circuit of FIG. 2;

FIG. 12 is a timing chart for the case where the data in the memory cell is written into the cache memory in the memory circuit of FIG. 10; and FIG. 13 is a timing chart for the case where the external input data is written into the cache memory in the memory circuit of FIG. 10.

DETAILED DESCRIPTION OF THE PREFERRED EMBODIMENTS

Hereinafter, referring to the accompanying drawings, a memory circuit with a built-in cache memory according to the present invention will be explained in detail.

Figure 1:
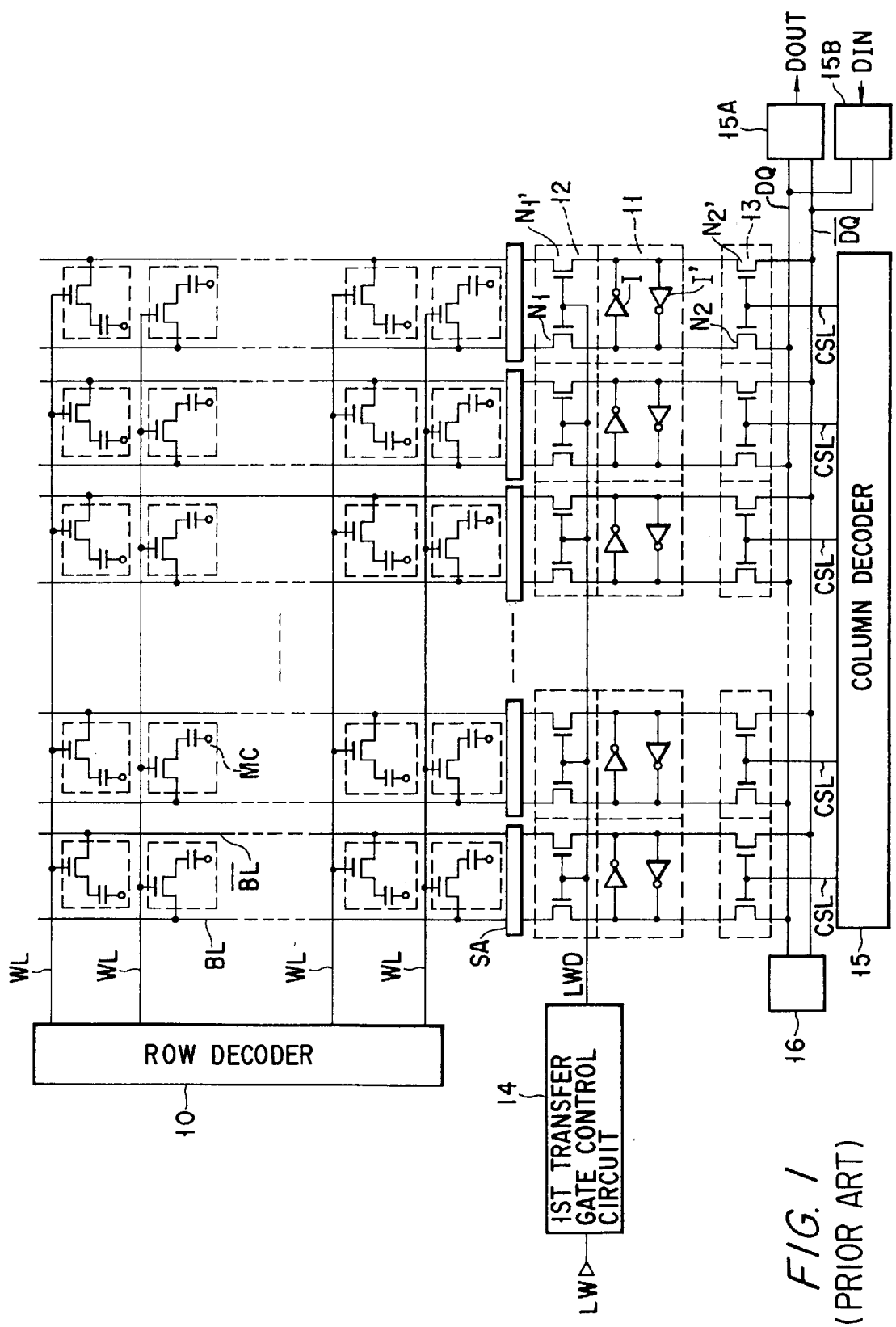
FIG. 1 is a circuit diagram of a conventional dynamic memory circuit.
Figure 2:
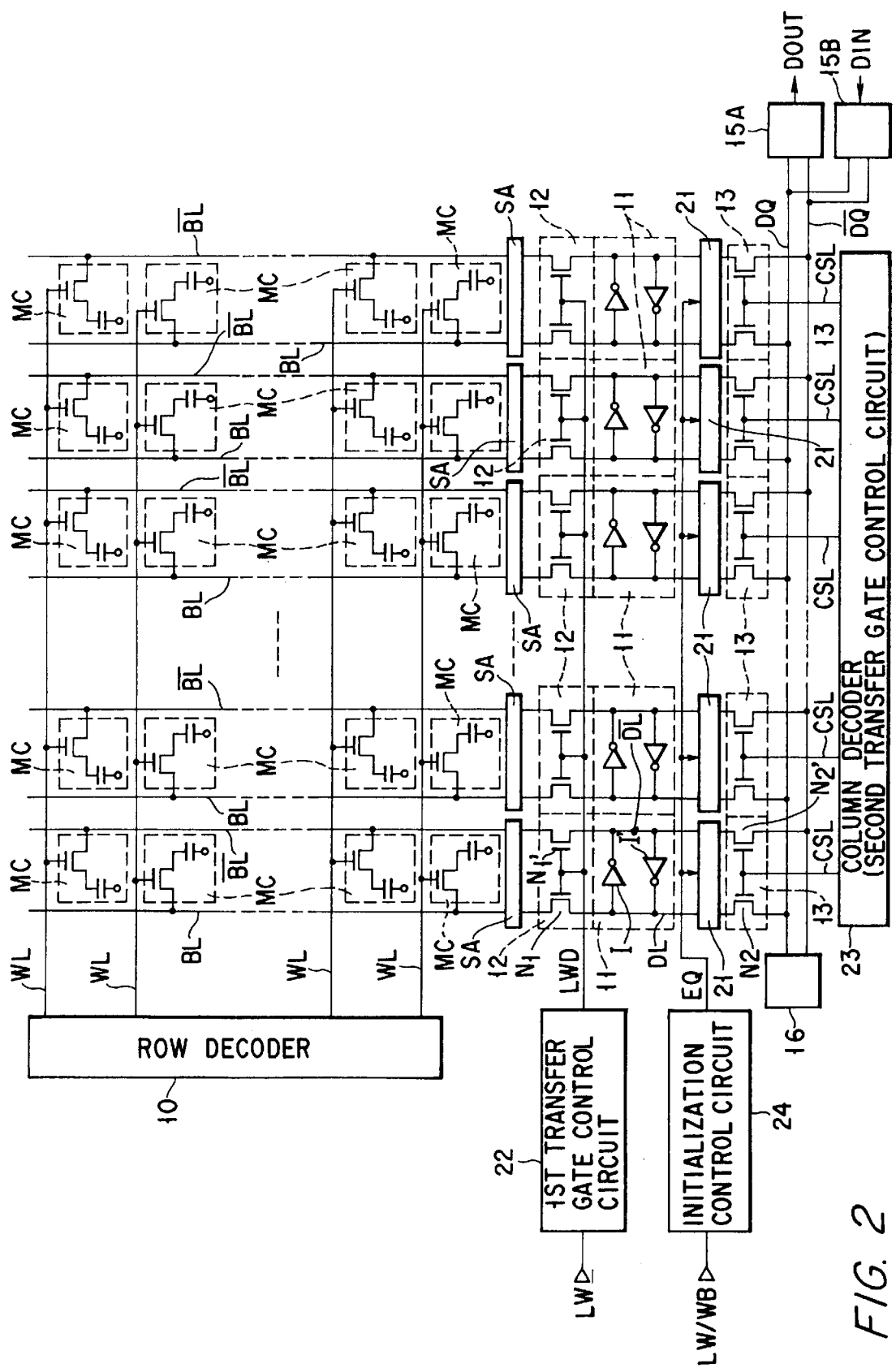
FIG. 2 is a circuit diagram of a dynamic memory circuit according to a first embodiment of the present invention.

FIG. 2 is a dynamic memory circuit with a built-in cache memory according to a first embodiment of the present invention.

Firstly, the configuration of the memory device will be described.

Each memory cell MC in a memory cell array is connected to a word line WL and a pair of bit lines BL and /BL. Each word line WL is connected to a row decoder 10. Each bit-line pair BL, /BL is connected to a sense amplifier SA.

Each cache memory 11 is composed of two inverter circuits I, I'. In this case, the cache memory 11 holds data. The cache memory may be composed of two MOS transistors cross-coupled, in which case the cache memory retains data dynamically.

Each first transfer gate 12 is made up of two n-channel MOS transistors N1, N1'. Each second transfer gate 13 is composed of two n-channel MOS transistors N2, N2'.

One end of each cache memory 11 is connected to the corresponding sense amplifier SA (bit line BL) via the corresponding transfer gate 12 and also to one of the corresponding DQ-line pair (data-line pair) DQ, /DQ via the corresponding data-line pair initializing circuit 21 and second transfer gate 13. The other end of each cache memory 11 is connected to the corresponding sense amplifier SA (bit line /BL) via the corresponding first transfer gate 12 and also to the other of the corresponding DQ-line pair DQ, /DQ via the corresponding data-line pair initializing circuit 21 and second transfer gate 13.

The first transfer gate 12 is controlled by the output signal LWD of a first transfer gate control circuit 22. The first transfer gate control circuit 22 receives a first write signal LW and outputs an output signal LWD.

The second transfer gate 13 is controlled by the output signal CSL of a column decoder (a second transfer gate control circuit) 23.

The data-line pair initializing circuit 21 is controlled by the output signal (pulse signal) EQ of an initialization control circuit 24. The data-line pair initializing circuit 21 has the function of initializing the data-line pair DL, /DL to a specific potential in advance, when data is written into the cache memory.

The initialization control circuit 24 receives a first write signal LW or a second write signal WB and outputs an output signal EQ. The first write signal LW is an instruction to transfer the data in the memory cell to the cache memory. The second write signal WB is an instruction to transfer the externally inputted data to the cache memory.

One end of the DQ-line pair is connected to input/output buffer circuits 15A, 15B, whereas the other end of the DQ-line pair is connected to a precharge circuit 16 for precharging the DQ-line pair.

Figure 3:
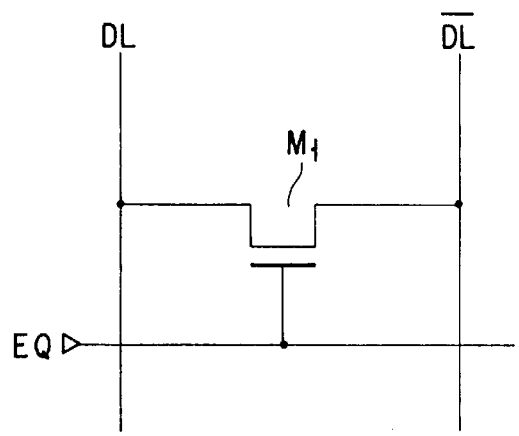
FIG. 3 is a circuit diagram of an example of the data-line initializing circuit in the memory circuit of FIG. 2.
Figure 4:
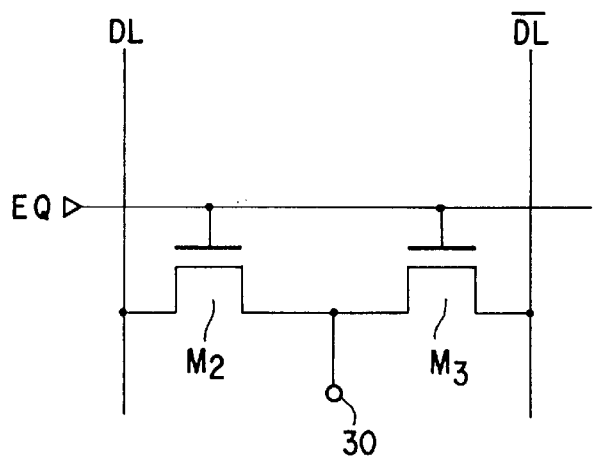
FIG. 4 is a circuit diagram of an example of the data-line initializing circuit in the memory circuit of FIG. 2.
Figure 5:
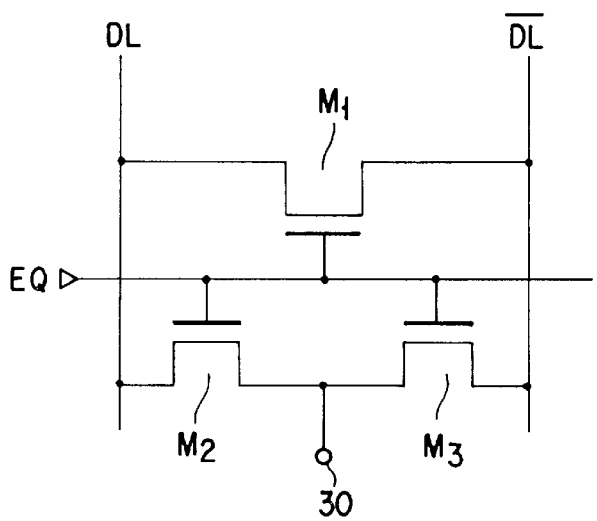
FIG. 5 is a circuit diagram of an example of the data-line initializing circuit in the memory circuit of FIG. 2.

FIGS. 3 to 5 each show examples of the structure of the data-line pair initializing circuit 21.

Firstly, the data-line pair initializing circuit of FIG. 3 will be explained.

The data-line pair initializing circuit is composed of a single n-channel MOS transistor M1. A pulse-like output signal EQ is outputted from the initialization control circuit 24 and inputted to the gate of the MOS transistor M1. The source and drain of the MOS transistor M1 are connected to a pair of data lines DL and /DL, respectively.

The data-line pair initialization circuit has the function of equalizing the potential of the data-line pair DL, /DL to the middle potential between the "1" level and "0" level, when the output signal ("1" level) EQ of the initialization control circuit 24 is inputted.

Specifically, when the output signal ("1" level) of the initialization control circuit 24 is inputted, this turns on the MOS transistor M1, forcing the data-line pair DL, /DL whose potential difference has been kept by the cache memory 11 until then to be initialized to the same potential.

The MOS transistor M1 forming the data-line pair initializing circuit may be of the p-channel type. In this case, the inverse of the output signal EQ from the initialization control circuit 24 is inputted to the data-line pair initializing circuit.

Explained next will be the data-line pair initializing circuit of FIG. 4.

The data-line pair initializing circuit is made up of two n-channel MOS transistors M2 and M3. A pulse-like output signal EQ outputted from the initialization control circuit 24 is inputted to the gates of the MOS transistors M2, M3.

The drain of the MOS transistor M2 is connected to the data line DL and its source is connected to a power-supply terminal 30. A specific potential, such as a power-supply potential VDD, a ground potential VSS, or the middle potential between the power-supply potential and the ground potential, is applied to the power-supply terminal 30. The drain of the MOS transistor M3 is connected to the data line /DL, and its source is connected to the power-supply terminal 30.

The data-line pair initializing circuit has the function of precharging the potential of the data-line pair DL, /DL to the potential of the power-supply terminal 30, when the output signal ("1" level) EQ of the initialization control circuit 24 is inputted.

Specifically, when output signal ("1" level) of the initialization control circuit 24 is inputted, this turns on the MOS transistors M2, M3, forcing the data-line pair DL, /DL whose potential difference has been kept by the cache memory 11 until then to be precharged (initialized) to a specific potential.

The MOS transistors M2, M3 constituting the data-line pair initializing circuit may be of the p-channel type. In this case, the inverse of the output signal EQ from the initialization control circuit 24 is inputted to the data-line pair initializing circuit.

Explained next will be the data-line pair initializing circuit of FIG. 5.

The data-line pair initializing circuit is composed of three n-channel MOS transistors M1 to M3. Namely, the data-line pair initializing circuit is a combination of the circuits of FIG. 3 and FIG. 4.

A pulse-like output signal EQ outputted from the initialization control circuit 24 is inputted to the gates of MOS transistors M1 to M3. The source and drain of the MOS transistor M1 are connected to a pair of data lines DL and /DL, respectively.

The drain of the MOS transistor M2 is connected to the data line DL and its source is connected to a power-supply terminal 30. A specific potential, such as a power-supply potential VDD, a ground potential VSS, or the middle potential between the power-supply potential and the ground potential, is applied to the power-supply terminal 30. The drain of the MOS transistor M3 is connected to the data line /DL and its source is connected to the power-supply terminal 30.

The data-line pair initializing circuit has the function of precharging and equalizing the potential of the data-line pair DL, /DL to the potential of the power-supply terminal 30, when the output signal ("1" level) EQ of the initialization control circuit 24 is inputted.

Specifically, when the output signal ("1" level) of the initialization control circuit 24 is inputted, this turns on the MOS transistors M1 to M3, forcing the data-line pair DL, /DL whose potential difference has been kept by the cache memory 11 until then to be precharged and equalized to the same potential.

The MOS transistors M1 to M3 constituting the data-line pair initializing circuit may be of the p-channel type. In this case, the inverse of the output signal EQ from the initialization control circuit 24 is inputted to the data-line pair initializing circuit.

Figure 6:
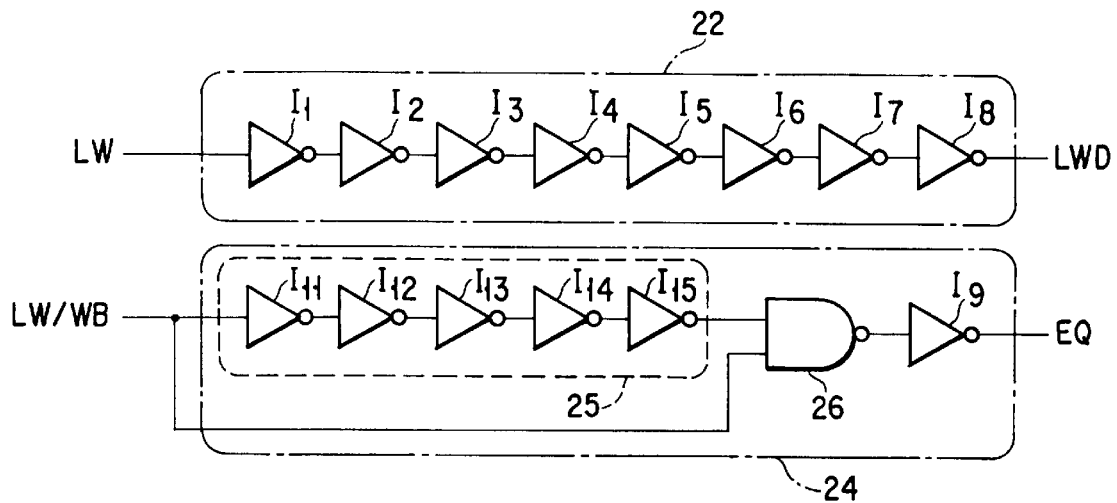
FIG. 6 is a circuit diagram of an example of the first transfer gate control circuit and initialization control circuit in the memory circuit of FIG. 2.
Figure 7:
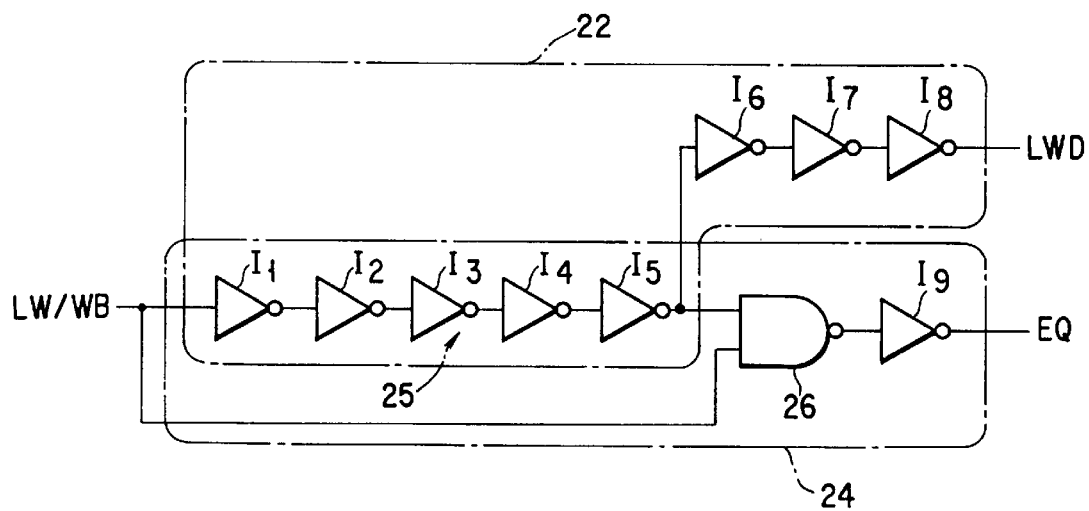
FIG. 7 is a circuit diagram of an example of the first transfer gate control circuit and initialization control circuit in the memory circuit of FIG. 2.

FIGS. 6 and 7 each show examples of the first transfer gate control circuit 22 and the initialization control circuit 24.

Firstly, the first transfer gate control circuit 22 and initialization control circuit 24 of FIG. 6 will be described.

The first transfer gate control circuit 22 is composed of eight inverter circuits I1 to I8 connected in series. The initialization control circuit 24 is made up of a delay circuit 25, a NAND circuit 26 to one input terminal of which a first or second write signal LW/WB is inputted directly and to the other input terminal of which the first or second write signal LW/WB is inputted via the delay circuit 25, and an inverter circuit I9 that is connected to the output terminal of the NAND circuit 26 and outputs an output signal EQ.

The delay circuit 25 is composed of five inverter circuits I11 to I15 connected in series.

The delay time offered by the first transfer gate control circuit 22 is set almost equal to the time from when the data-line pair initializing circuit 21 outputs a pulse-like output signal EQ until the data-line pair DL, /DL is forced to be initialized.

Explained next will be the first transfer gate control circuit 22 and initialization control circuit 24 of FIG. 7.

This embodiment is an example of the case where the delay circuit constituting the first transfer gate control circuit 22 and the delay circuit 25 in the initialization control circuit have some portion in common.

Specifically, the first transfer gate control circuit 22 is composed of eight inverter circuits I1 to I8 connected in series. The initialization control circuit 24 is composed of a delay circuit 25 made up of five inverter circuits I1 to I5 connected in series, a NAND circuit 26 to one input terminal of which a first or second write signal LW/WB is inputted directly and to the other input terminal of which the first or second write signal LW/WB is inputted via the delay circuit 25, and an inverter circuit I9 that is connected to the output terminal of the NAND circuit 26 and outputs an output signal EQ.

Explained next will be the dynamic memory circuit with a built-in cache memory of FIGS. 2 to 7.

There are two cases where data is written into the cache memory: one case where the data read from the memory cell MC is written via the first transfer gate 12 and the other case where the externally inputted data is written via the second transfer gate 13.

Hereinafter, these two cases will be described.

Referring to the timing chart of FIG. 8, explanation will given for the operation of the memory device in writing the data read from the memory cell MC via the first transfer gate 12.

When the row decoder selects a single word line WL, or when the word line goes to the "1" level, the data in the memory cell MC connected to the word line WL will be outputted onto the bit-line pair BL, /BL. The data outputted on the bit-line pair BL, /BL will be amplified by the sense amplifier SA.

On the other hand, after the word line has been selected and the sense amplifier SA has operated, the first write signal LW changes to the "1" level.

When the first write signal LW has changed to the "1" level, the initialization control circuit 24 outputs an output signal (pulse signal) EQ of the "1" level for a specific period (equal to the delay time of the delay circuit 25) starting from that point in time.

Therefore, during the time when the output signal EQ is at the "1" level, the data-line pair initializing circuit 21 is activated, forcing the data-line pair DL, /DL to be equalized (or precharged), or initialized.

To delay the first write signal LW for a specific period, the first transfer gate control circuit 22 places the output signal LWD at the "1" level, after the specific period has elapsed since the first write signal LW changed to the "1" level. The period is set almost equal to the time elapsed until the data-line pair initializing circuit 21 initializes the data-line pair DL, /DL compulsively.

Therefore, the data-line pair DL, /DL is initialized. Almost at the same time when the output signal EQ has changed to the "0" level again, or after the output signal EQ has changed to the "0" level, the output signal LWD of the first transfer gate control circuit 22 goes to the "1" level.

When the output signal LWD of the first transfer gate control circuit 22 has gone to the "1" level, the first transfer gate 12 is enabled and the bit-line data sufficiently amplified by the sense amplifier SA is transferred to the data-line pair and written into the cache memory 11 at high speeds.

If the DQ-line pair that inputs and outputs data has been initialized by a precharge circuit 16, one second transfer gate 13 selected by the column decoder 23 may be kept enabled in writing the data in the memory cell into the cache memory.

Because the data-line pair DL, /DL has been equalized (initialized) previously as described above, the data already stored in the cache memory has been destroyed.

Therefore, even when the reverse of the data already stored in the cache memory is written into the cache memory, data is written into the cache memory at high speeds.

Hereinafter, referring to the timing chart of FIG. 9, explanation will be given for the case where the externally inputted data is written via the second transfer gate 13.

When the second write signal WB has changed to the "1" level, the initialization control circuit 24 outputs an output signal (pulse signal) EQ of the "1" level for a specific period (equal to the delay time of the delay circuit 25) from that time.

Therefore, during the time when the output signal EQ is at the "1" level, the data-line pair initializing circuit 21 is activated, forcing the data-line pair DL, /DL to be equalized (or precharged), or initialized.

Thereafter, the output signal CSL of the column decoder 23 inputted to a specific second transfer gate 13 changes to the "1" level, enabling the second transfer gate 13. This connects the DQ-line pair DQ, /DQ to the data-line pair DL, /DL, thereby storing the external input data into the cache memory 11.

After a specific period has elapsed since the second write signal WB changed to the "1" level, the column decoder 23 places the output signal CSL at the "1" level. The period is set almost equal to the time elapsed until the data-line pair initializing circuit 21 initializes the data-line pair DL, /DL compulsively.

Therefore, the data-line pair DL, /DL is initialized. Almost at the same time when the output signal EQ has changed to the "0" level again, or after the output signal EQ has changed to the "0" level, the output signal CSL of the column decoder 23 goes to the "1" level.

When the output signal CSL of the column decoder 23 has gone to the "1" level, the second transfer gate 13 is enabled and the externally inputted data is transferred to the data-line pair DL, /DL and written into the cache memory 11 at high speeds.

In the case where the data written in the cache memory 11 is written in the memory cell, the first transfer gate 12 may be kept enabled in writing the external input data into the cache memory 11.

The external input data may have been transferred to the DQ-line pair DQ, /DQ before the data-line pair DL, /DL is initialized.

The timing with which the second transfer gate 13 is enabled by the output signal CSL of the column decoder can be controlled by the second write signal WB. Furthermore, the timing with which the second transfer gate 13 is enabled can be adjusted by delaying the output signal CSL of the column decoder for a particular time by a delay means.

When the data stored in the cache memory 11 is read outside again, the column decoder 23 enables the second transfer gate 13, thereby transferring the data stored in the cache memory 11 to the DQ-line pair.

Because the data-line pair DL, /DL has been equalized (initialized) previously as described above, the data already stored in the cache memory has been destroyed.

Therefore, even when the external input data which is the reverse of the data already stored in the cache memory is written into the cache memory, data is written into the cache memory at high speeds.

Figure 10:
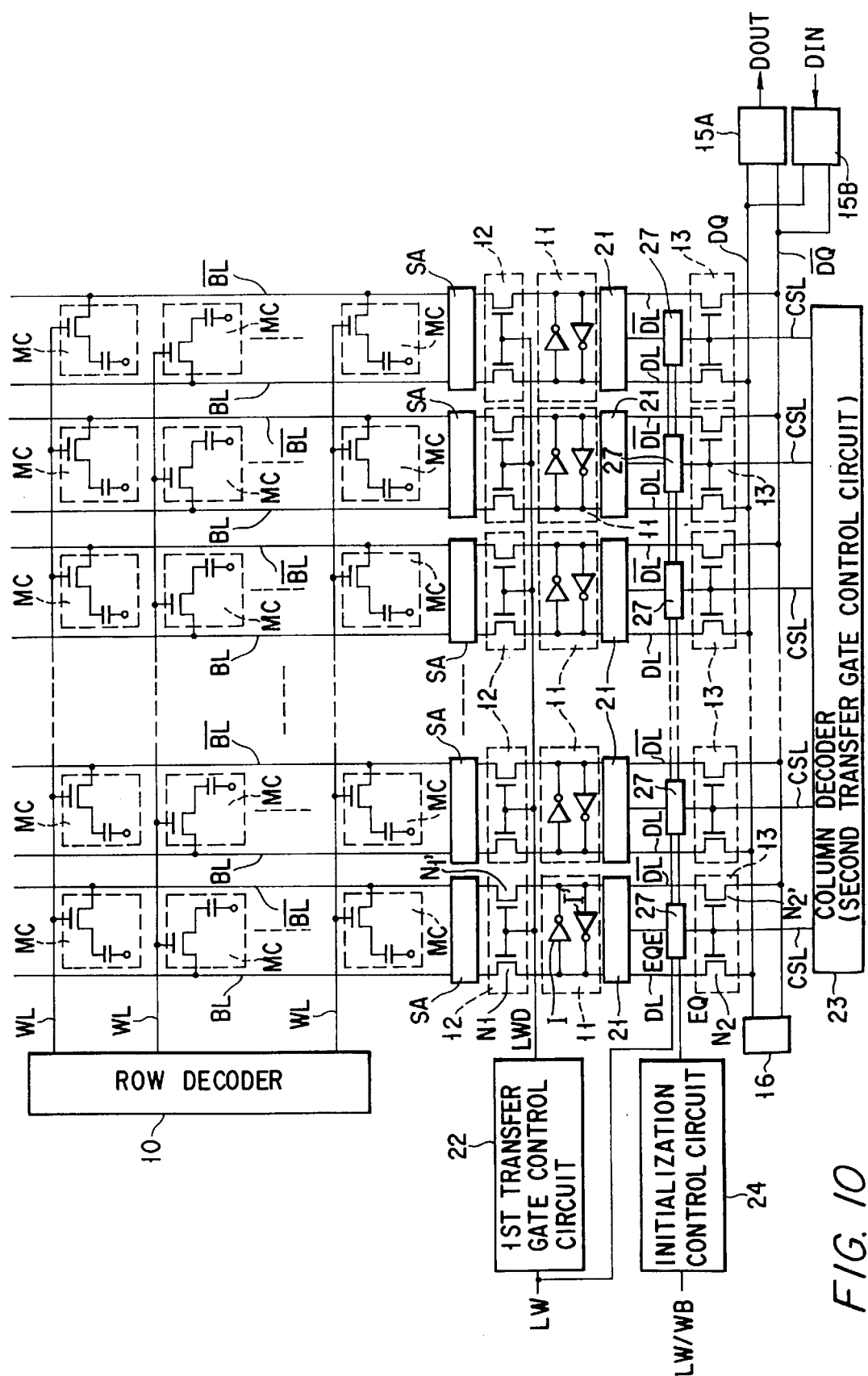
FIG. 10 is a circuit diagram of a dynamic memory circuit according to a second embodiment of the present invention.

FIG. 10 is a dynamic memory circuit with a builtin cache memory according to a second embodiment of the present invention.

To begin with, the configuration of the memory device will be explained.

Each memory cell MC in a memory cell array is connected to a word line WL and a pair of bit lines BL and /BL. Each word line WL is connected to a row decoder 10. Each bit-line pair BL, /BL is connected to a sense amplifier SA.

Each cache memory 11 is composed of two inverter circuits I, I' and holds data statically. The cache memory 11 may be made up of two MOS transistors cross-coupled, in which case the cache memory holds data dynamically.

Each first transfer gate 12 is made up of two n-channel MOS transistors N1, N1'. Each second transfer gate 13 is composed of two n-channel MOS transistors N2, N2'.

One end of each cache memory 11 is connected to the corresponding sense amplifier SA (bit line BL) via the corresponding first transfer gate 12 and also to one of the corresponding DQ-line pair DQ, /DQ via the corresponding data-line pair initializing circuit 21 and second transfer gate 13. The other end of each cache memory 11 is connected to the corresponding sense amplifier SA (bit line /BL) via the corresponding transfer gate 12 and also to the other of the corresponding DQ-line pair DQ, /DQ via the corresponding data-line pair initializing circuit 21 and second transfer gate 13.

The first transfer gate 12 is controlled by the output signal LWD of a first transfer gate control circuit 22. The first transfer gate control circuit 22 receives a first write signal LW and outputs an output signal LWD.

The second transfer gate 13 is controlled by the output signal CSL of a column decoder (a second transfer gate control circuit) 23.

The data-line pair initializing circuit 21 is controlled by a data-line pair initialization select circuit 27. The data-line pair initialization select circuit 27 is controlled by the first write signal LW, the output signal (pulse signal) EQ of the initialization control circuit 24, and the output signal CSL of the column decoder, and outputs an output signal EQE.

The data-line pair initialization select circuit 27 initializes all of the data-line pairs DL, /DL, when the data in the memory cell is written into the cache memory, and one data-line pair DQ, /DQ in the column selected by the column decoder, when the externally inputted data is written into the cache memory. Specifically, the data-line pair initializing circuit 21 and data-line pair initialization select circuit 27 have the function of initializing data-line pairs DL, /DL to a specific potential in advance in writing data into the cache memory.

The initialization control circuit 24 receives a first write signal LW or a second write signal WB and outputs an output signal EQ. The first write signal LW is an instruction to transfer the data in the memory cell to the cache memory. The second write signal WB is an instruction to transfer the externally inputted data to the cache memory.

One end of the DQ-line pair is connected to input/output buffer circuits 15A, 15B, whereas the other end of the DQ-line pair is connected to a precharge circuit 16 for precharging DQ-line pairs.

For the data-line pair initializing circuit 21 in the memory circuit of FIG. 10, the circuits constructed as shown in FIGS. 3 to 5 can be used, for example.

In FIGS. 3 to 5, the control signal inputted to the gates of MOS transistors M1 to M3 is the output signal EQE of the data-line pair initialization select circuit 27.

The data-line pair initializing circuit 21 has the function of equalizing the potential of the data-line pair DL, /DL to the middle potential between the "1" level and "0" level, when the output signal ("1" level) EQE of the data-line pair initialization select circuit 27 is inputted.

The MOS transistors M1 to M3 constituting the data-line pair initializing circuit may be of the p-channel type. In this case, the inverse of the output signal EQE from the data-line pair initialization select circuit 27 is inputted to the data-line pair initialization select circuit 27.

Figure 11:
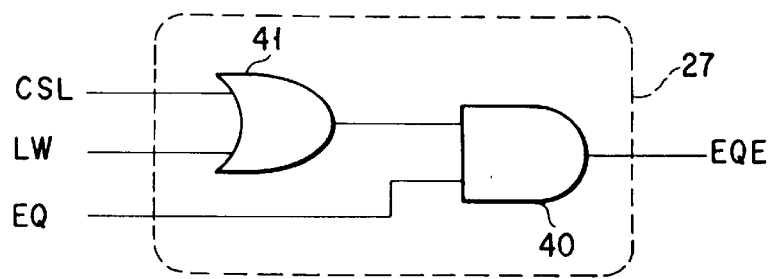
FIG. 11 is a circuit diagram of an example of the data-line pair initialization select circuit in the memory circuit of FIG. 10.

FIG. 11 shows an example of the data-line pair initialization select circuit 27 in the memory device of FIG. 10.

The data-line pair initialization select circuit 27 is composed of an AND circuit 40 and an OR circuit 41.

To the OR circuit 41, the first write signal LW and the output signal CSL of the column decoder 23 are inputted. The output signal EQ of the initialization control circuit 24 and the output of the OR circuit 41 are inputted to the AND circuit 40, which outputs an output signal EQE.

The data-line initialization select circuit 27 receives the output signal ("1" level) EQ of the initialization control circuit 24 and, when the first write signal LW or the output signal CSL of the column decoder is at the "1" level, outputs an output signal ("1" level) to operate the data-line pair initializing circuit 21.

When the output ("1" level) of the data-line pair initialization select circuit 27 is inputted, this turns on the MOS transistors M1 to M3 in the data-line pair initializing circuit 21, forcing the data-line pair DL, /DL whose potential difference has been kept by the cache memory 11 until that time to be initialized to the same potential.

For the first transfer gate control circuit 22 and initialization control circuit 24 in the memory device of FIG. 10, the circuits constructed as shown in FIGS. 6 and 7 can be used.

As described in FIGS. 6 and 7, the delay time offered by the first transfer gate control circuit 22 is set almost equal to the time from when the data-line pair initializing circuit 21 outputs a pulse-like output signal EQ until the data-line pair DL, /DL is forced to be initialized.

Hereinafter, the operation of the dynamic memory circuit with a built-in cache memory of FIGS. 10 and 11 will be explained.

There are two cases where data is written into the cache memory: one case where the data read from the memory cell MC is written via the first transfer gate 12 and the other case where the externally inputted data is written via the second transfer gate 13.

Hereinafter, these two cases will be described.

Referring to the timing chart of FIG. 12, explanation will given for the operation of the memory device in writing via the first transfer gate 12 the data read from the memory cell MC.

When the row decoder selects a single word line WL, or when the word line goes to the "1" level, the data in the memory cell MC connected to the word line WL will be outputted onto the bit-line pair BL, /BL. The data outputted on the bit-line pair BL, /BL will be amplified by the sense amplifier SA.

On the other hand, after the word line has been selected and the sense amplifier SA has operated, the first write signal LW changes to the "1" level.

When the first write signal LW has changed to the "1" level, the initialization control circuit 24 outputs an output signal (pulse signal) EQ of the "1" level for a specific period (equal to the delay time of the delay circuit 25) starting from that point in time.

When the output signal ("1" level) EQ of the initialization control circuit 24 has been inputted to the data-line pair initialization select circuit 27, all of the data-line pair initialization select circuits 27 output an output signal (pulse signal) EQE of the "1" level, because the first write signal LW is at the "1" level.

Therefore, during the time when the output signal EQE is at the "1" level, the data-line pair initializing circuit 21 is activated, forcing the data-line pairs DL, /DL in all of the columns to be equalized (or precharged), or initialized.

To delay the first write signal LW for a specific period, the first transfer gate control circuit 22 places the output signal LWD at the "1" level, after the specific period has elapsed since the first write signal LW changed to the "1" level. The period is set almost equal to the time elapsed until the data-line pair initializing circuit 21 initializes the data-line pairs DL, /DL compulsively.

Therefore, the data-line pairs DL, /DL are initialized. Almost at the same time when the output signal EQ has changed to the "0" level again, or after the output signal EQ has changed to the "0" level, the output signal LWD of the first transfer gate control circuit 22 goes to the "1" level.

When the output signal LWD of the first transfer gate control circuit 22 has gone to the "1" level, the first transfer gate 12 is enabled and the bit line data sufficiently amplified by the sense amplifier SA is transferred to the data-line pair and written into the cache memory 11 at high speeds.

If the DQ-line pair that inputs and outputs data has been initialized by a precharge circuit, one second transfer gate 13 selected by the column decoder 23 may be kept enabled in writing the data in the memory cell into the cache memory.

Because the data-line pairs DL, /DL have been equalized (initialized) previously as described above, the data already stored in the cache memories have been destroyed.

Therefore, even when the reverse of the data already stored in the cache memory is written into the cache memory, data is written into the cache memory at high speeds.

Hereinafter, referring to the timing chart of FIG. 13, explanation will be given for the case where the externally inputted data is written via the second transfer gate 13.

When the second write signal WB has changed to the "1" level, the initialization control circuit 24 outputs an output signal (pulse signal) EQ of the "1" level for a specific period (equal to the delay time of the delay circuit 25) from that time.

When the output signal ("1" level) EQ of the initialization control circuit 24 is inputted to each data-line pair initialization select circuit 27, the data-line pair initialization select circuit 27 in each column outputs an output signal (pulse signal) EQE of the "1" level, when the output signal CSL from the column decoder 23 is at the "1" level. At this time, the first write signal LW remains at the "1" level.

Specifically, only the data-line pair initialization select circuit 27 in the column selected by the column decoder 23 outputs an output signal (pulse signal) EQE of the "1" level, whereas the output signals from the data-line pair initialization select circuits 27 in the other columns remain at the "0" level.

Therefore, during the time when the output signal EQ is at the "1" level, only the data-line pair initializing circuit 21 in the column selected by the column decoder 23 is activated, forcing the data-line pair DL, /DL in the column to be selectively equalized (or precharged), or initialized.

The second transfer gate 13 in the column selected by the column decoder 23 simultaneously with the initialization is enabled. This connects the DO-line pair DQ, /DQ to the data-line pair DL, /DL in the column selected by the column decoder 23, thereby allowing the external input data to be stored in the cache memory 11 in the column.

In this embodiment, the time when the second write signal WB is changed to the "1" level to initialize the data-line pair DL, /DL is the same as the time when the output signal CSL of the column decoder is changed to the "1" level to enable the second transfer gate 13.

In this case, because the data in the DQ-line pair is retained by DQ buffers 15a, 15b, the data is never lost. Therefore, after the initialization of the data-line pair DL, /DL is completed, the data in the DQ-line pair is written into the cache memory 11 at high speeds via the second transfer gate 13.

The second transfer gate 13 may be enabled after the data-line pair DL, /DL has been initialized.

In this case, the output signal CSL of the column decoder 23 is supplied directly to the data-line pair initialization select circuit 27, whereas the output signal CSL of the column decoder 23 is supplied to the second transfer gate 13 via a delay circuit.

The delay time in the delay circuit is set to such timing as allows the second transfer gate 13 to be enabled at the same time or after the data-line pair initializing circuit 21 initializes the data-line pair DL, /DL compulsively.

Therefore, the externally inputted data is transferred to the data-line pair DL, /DL and written into the cache memory 11 at high speeds.

The external input data may be transferred to the DQ-line pair DQ, /DQ before the data-line pair DL, /DL is initialized.

When the data stored in the cache memory 11 is read outside again, the precharge circuit 16 precharges the DQ-line pair DQ, /DQ and the column decoder 23 enables the second transfer gate 13, thereby transferring the data stored in the cache memory 11 to the DQ-line pair.

Because the data-line pair DL, /DL has been equalized (initialized) previously, the data already stored in the cache memory has been destroyed.

Therefore, even when the external input data that is the reverse of the data already stored in the cache memory is written into the cache memory, the data is written in the cache memory at high speeds.

The memory circuit with a built-in cache memory has the following advantages.

The data-line pair initializing circuit equalizes (initializes) the data-line pair before the data is written into the cache memory, thereby destroying the data already stored in the cache memory. Therefore, the time required to write data can be shortened as compared with the case where the data to be written into the cache memory is the reverse of the data already stored in the cache memory.

By providing the data-line initialization select circuit, the data-line pairs in all of the columns can be equalized (initialized) in writing the data from the memory cell into the cache memory, whereas only the cache memory in the column selected by the column decoder can be equalized (initialized) in externally writing the data into the cache memory. This eliminates a waste of circuit operation in initializing the data-line pairs.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A memory circuit with a built-in cache memory comprising:

a first transfer gate connected between a bit-line pair and a first data-line pair;

a second transfer gate connected between a second data-line pair and said first data-line pair, said second transfer gate being controlled by a column select signal;

a cache memory connected to said first data-line pair;

a column decoder for outputting the column select signal to turn on said second transfer gate of one of a plurality of columns;

a transfer gate control circuit for transferring a first write signal to said first transfer gate of each column, said transfer gate control gate circuit delaying transfer of the first write signal by a delay period;

an initialization control circuit for outputting an output signal responsive to the first write signal or a second write signal, a period of the output signal being equal to or less than the delay period;

means for inputting the first write signal to said transfer gate control circuit, inputting the first write signal to said initialization control circuit when data stored in a memory cell is written in said cache memory, and inputting the second write signal to said initialization control circuit when data stored in said second data-line pair is written in said cache memory; and an equalizing/precharging circuit for receiving the output signal of the initialization control circuit and performing one of equalizing, precharging, and equalizing and precharging potential of the first data-line pair prior to when said first transfer gate in each column is turned on by receiving the first write signal, and prior to when said second transfer gate in a column is turned on by receiving the column select signal.

2. A memory circuit according to claim 1, wherein said equalizing/precharging circuit includes a first data-line pair initializing circuit for short-circuiting said first data-line pair.

3. A memory circuit according to claim 2, wherein said first data-line pair initializing circuit includes a MOS transistor having a source connected to one of said first data-line pair, a drain connected to the outer of said first data-line pair, and a gate connected to said initialization control circuit.

4. A memory circuit according to claim 2, wherein said first data-line pair initializing circuit includes first and second MOS transistors, said first MOS transistor having a source connected to a power-supply terminal applied with a specific potential, a drain connected to one of said first data-line pair, and a gate connected to said initialization control circuit, and said second MOS transistor having a source connected to said power-supply terminal, a drain connected to the other of said first data-line pair, and a gate connected to said initialization control circuit.

5. A memory circuit with a built-in cache memory comprising:

a plurality of columns, wherein each column includes,
   a first transfer gate connected between a bit-line pair and a first data-line pair;
   a second transfer gate connected between a second data-line pair and said first data-line pair, said second transfer gate being controlled by a column select signal;
   a cache memory connected to said first data-line pair;

a column decoder for outputting the column select signal to turn on said second transfer gate of one of said plurality of columns;

a transfer gate control circuit for transferring a first write signal to said first transfer gate of each column, said transfer gate control circuit delaying transfer of the first write signal by a delay period;

an initialization control circuit for outputting an output signal responsive to the first write signal or a second write signal, a period of the output signal being equal to or less than the delay period;

means for inputting the first write signal to said transfer gate control circuit, inputting the first write signal to said initialization control circuit when data stored in a memory cell is written in said cache memory, and inputting the second write signal to said initialization control circuit when data stored in said second data-line pair is written in said cache memory; and an equalizing/precharging circuit for receiving the output signal of the initialization control circuit and performing one of equalizing, precharging, and equalizing and precharging potential of the first data-line pair prior to when said first transfer gate in each column is turned on by receiving the first write signal, and prior to when said second transfer gate in a column is turned on by receiving the column select signal.

6. A memory circuit according to claim 5, wherein said equalizing/precharging circuit includes a first data-line pair initializing circuit for short-circuiting said first data-line pair, and a first data-line pair initialization select circuit for selecting one or more columns that short-circuit first data-line pairs from said plurality of columns.

7. A memory circuit according to claim 6, wherein said first data-line pair initializing circuit includes a MOS transistor having a source connected to one of said first data-line pair, a drain connected to the other of said first data-line pair, and a gate connected to said first data-line pair initialization select circuit.

8. A memory circuit according to claim 6, wherein said first data-line pair initializing circuit includes first and second MOS transistors, said first MOS transistor having a source connected to a power-supply terminal applied with a specific potential, a drain connected to one of said first data-line pair, and a gate connected to said initialization control circuit, and said second MOS transistor having a source connected to said power-supply terminal, a drain connected to the other of said first data-line pair, and a gate connected to said initialization control circuit.

9. A memory circuit comprising:

a memory cell array including a plurality of memory cells arranged in rows and columns;

a plurality of bit line pairs, each bit line pair coupled to each memory cell in a corresponding one of the columns, wherein each column includes,
   a first data-line pair,
   cache memory connected to said first data-line pair,
   a first transfer gate operatively coupled between said corresponding bit line pair and said first data-line pair for transferring data between one of said memory cells and said cache memory,
   a second transfer gate controlled by a column select signal for transferring data to said cache memory, and
   an equalizing/precharging circuit for performing one of equalizing, precharging, and equalizing and precharging potential of said first data line pair prior to said first transfer gate or said second transfer gate transferring data to said cache memory;

a second data line-pair operatively connected to said cache memory via said second transfer gate and said equalizing/precharging circuit;

a transfer gate control circuit for receiving a first write signal, and after a delay period, outputting a first control signal for controlling said first transfer gate;

a column decoder for outputting the column select signal;

an initialization control circuit for receiving the first write signal when data stored in a memory cell is transferred to said cache memory or for receiving a second write signal when data stored in said second data-line pair is transferred to said cache memory, and outputting a second control signal which controls said precharging/equalizing circuit, a period of the second control signal being equal to or less than the delay period.

10. A memory circuit according to claim 9, wherein said equalizing/precharging circuit includes a data-line pair initializing circuit for short-circuiting said first data-line pair, and a data-line pair initialization select circuit for selecting at least one column that short-circuits said first data-line pair in the at least one column.

11. A memory circuit according to claim 10, wherein said data-line pair initializing circuit includes a MOS transistor having a source connected to one of said first data-line pair, a drain connected to the other of said first data-line pair, and a gate connected to said data-line pair initialization select circuit.

12. A memory circuit according to claim 10, wherein said data-line pair initializing circuit includes first and second MOS transistors, said first MOS transistor having a source connected to a power-supply terminal applied with a specific potential, a drain connected to one of said first data-line pair, and a gate connected to said initialization control circuit, and said second MOS transistor having a source connected to said power-supply terminal, a drain connected to the other of said first data-line pair, and a gate connected to said initialization control circuit.

13. A memory circuit according to claim 10, wherein said data-line pair initialization select circuit receives the first write signal, the second control signal and the column select signal and outputs a third control signal for controlling said data-line pair initialization circuit.

* * * * *